United States Patent [19]

Dagostino et al.

[11] Patent Number: 5,064,583
[45] Date of Patent: Nov. 12, 1991

[54] METHOD FOR APPLYING MOLD RELEASE COATING TO SEPARATOR PLATES FOR MOLDING PRINTED CIRCUIT BOARDS

[75] Inventors: John J. Dagostino, Santa Clara; Gregory L. Lucas, Newark, both of Calif.

[73] Assignee: Zycon Corporation, Santa Clara, Calif.

[21] Appl. No.: 388,252

[22] Filed: Aug. 1, 1989

[51] Int. Cl.⁵ .................. B28B 7/38; B28B 11/04
[52] U.S. Cl. .................. 264/39; 264/104; 264/154; 264/219; 264/272.11; 264/338; 156/307.3; 427/133; 427/387; 427/421
[58] Field of Search .......... 264/39, 104, 272.11, 264/154, 219; 425/406, 411; 156/247, 307.3, 307.4, 313, 314, 315, 323, 330; 427/133, 387, 421

[56] References Cited

U.S. PATENT DOCUMENTS

| | | | |
|---|---|---|---|
| 2,674,619 | 4/1954 | Lundsted | 260/485 |
| 2,786,080 | 3/1957 | Patton Jr. | 260/611.5 |
| 3,290,760 | 12/1966 | Cave | 29/155.5 |
| 3,421,211 | 1/1969 | Eaves et al. | 29/626 |
| 3,984,598 | 10/1976 | Sarazin et al. | 156/150 |
| 4,201,616 | 5/1980 | Chellis et al. | 156/307.1 |
| 4,371,476 | 2/1983 | Newkirk et al. | 260/709 |
| 4,571,279 | 2/1986 | Oizumi et al. | 156/247 |
| 4,713,284 | 12/1987 | Hasegawa et al. | 428/246 |
| 4,753,847 | 6/1988 | Wilheim et al. | 428/411.1 |
| 4,855,184 | 8/1989 | Klun et al. | 427/331 |

Primary Examiner—Hubert C. Lorin
Assistant Examiner—Angela Ortiz
Attorney, Agent, or Firm—John A. Bucher

[57] ABSTRACT

A method of conditioning separator mold plates for repeated use in high temperature sequential molding of printed circuit board laminates comprises the step of integrally applying at least one thin, continuous coat, preferably on the order of about 1 microinch, of a silane-based mold release composition prior to each sequential molding operation for facilitating repeated use of the plates in sequential molding operations the silane-based mold release composition is preferably applied in a continuous automated process including a spray gun, preferably of an air atomized type and more preferably of a high transfer efficiency type, for applying the coating followed by an infrared heating step, the separator mold plates being carried by a conveyor through a tunnel including the spray gun and infrared heater. Separator mold plates formed as a product of the process are adapted for use in large numbers of sequential molding operations with an additional coat of the silane-based mold release compound being applied prior to each operation because of the microinch thickness of each coating.

7 Claims, 3 Drawing Sheets

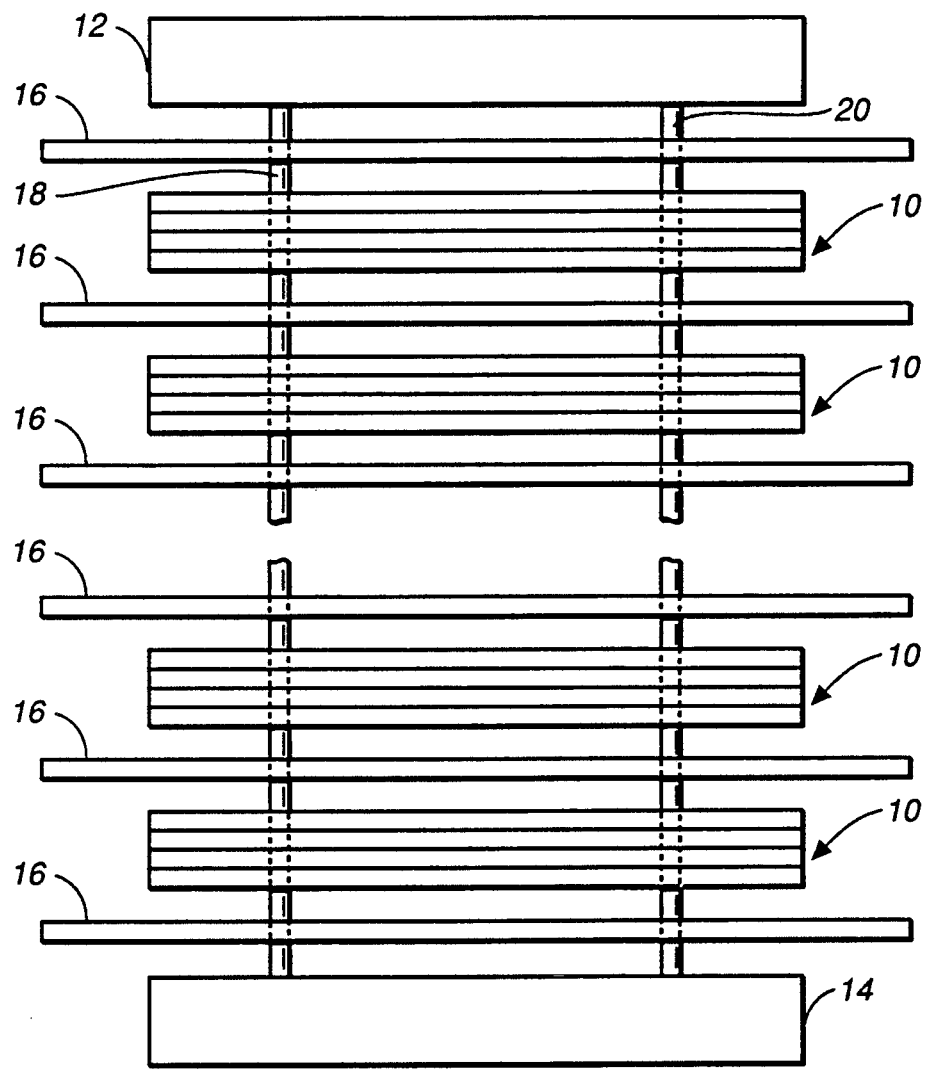
FIG._1

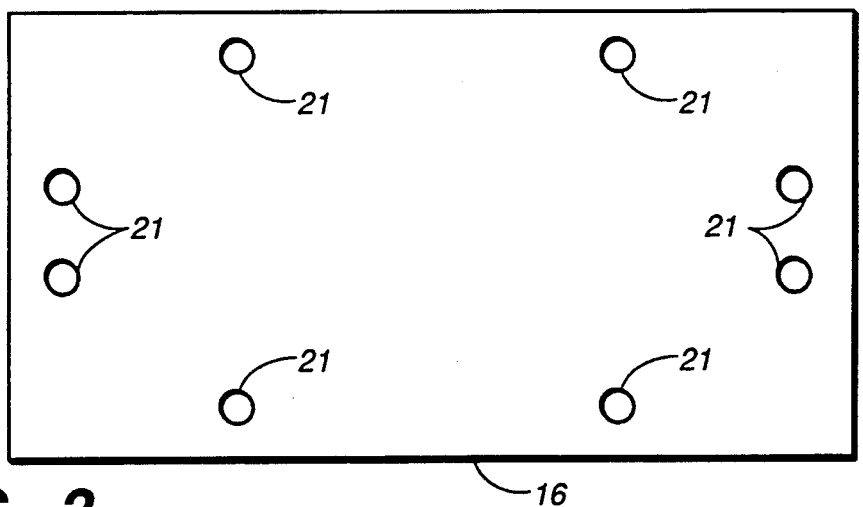
FIG._2
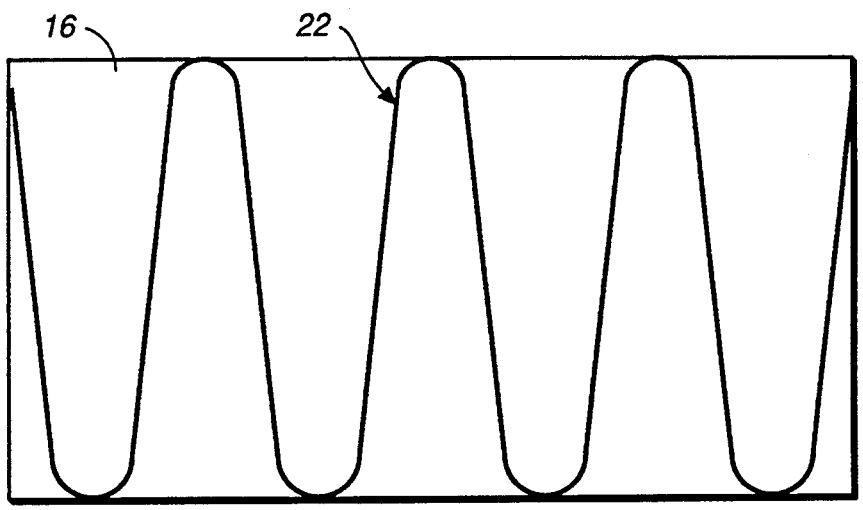
FIG._3
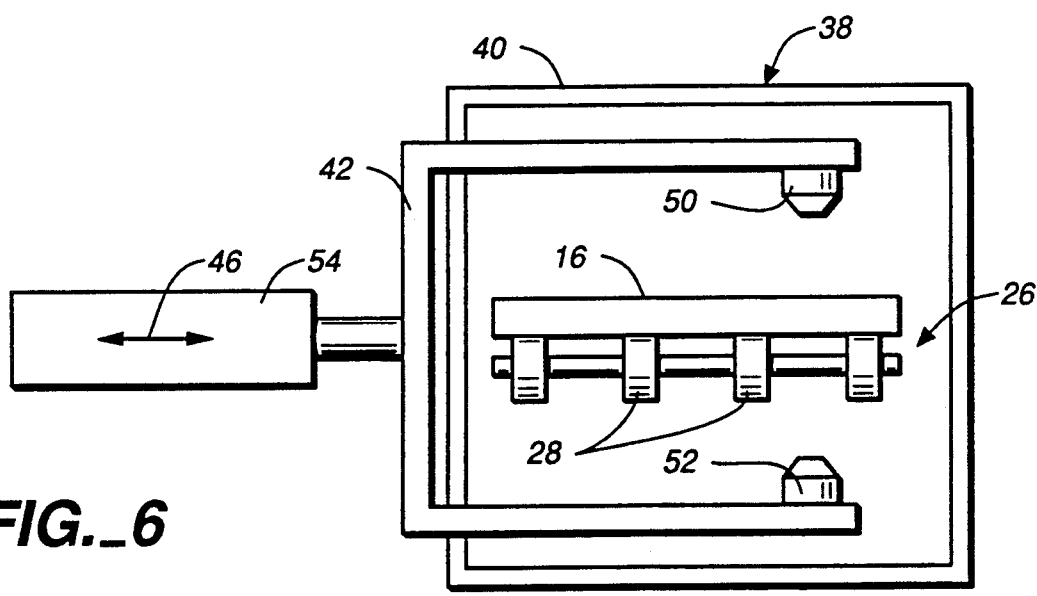
FIG._6

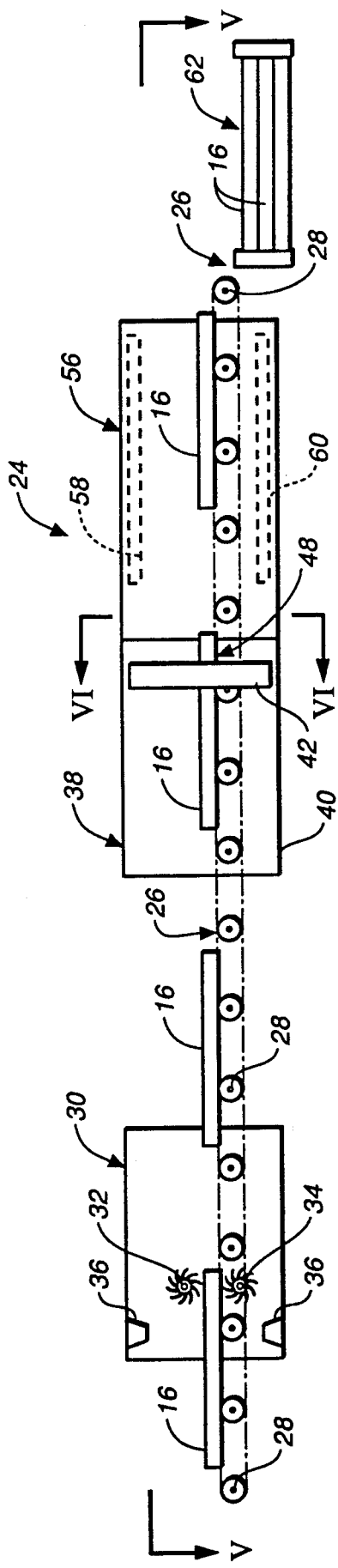
FIG._4
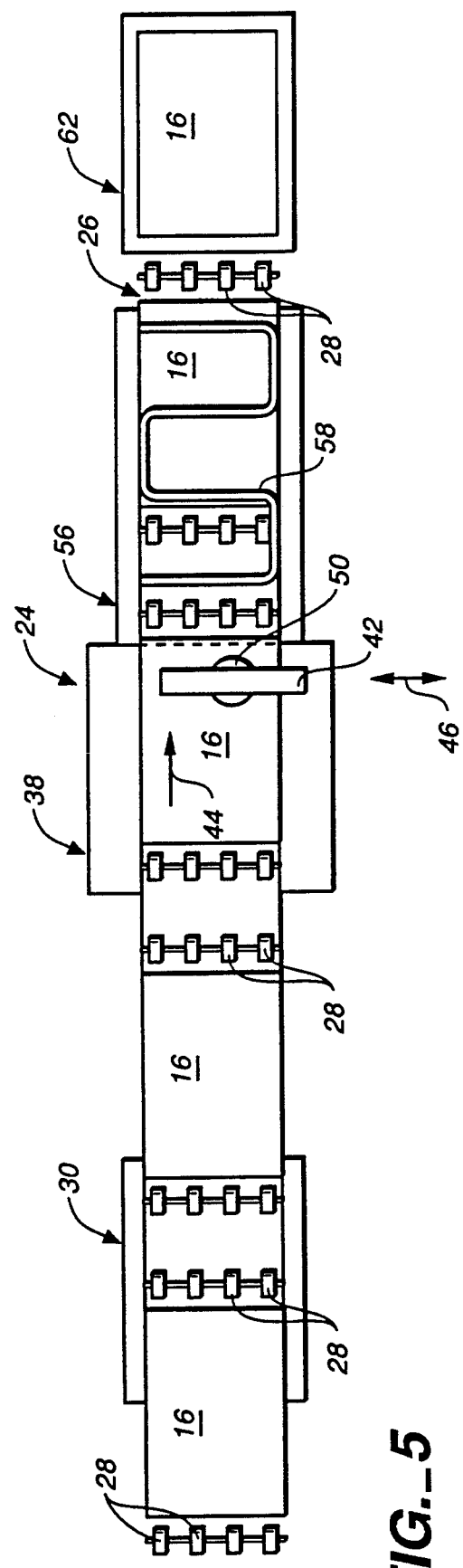
FIG._5

METHOD FOR APPLYING MOLD RELEASE COATING TO SEPARATOR PLATES FOR MOLDING PRINTED CIRCUIT BOARDS

FIELD OF THE INVENTION

The present invention relates to a method of high temperature molding of printed circuit board laminates and more particularly to a method of conditioning separator mold plates for repeated use in such molding operations and a separator mold plate or plates as products of the conditioning method.

BACKGROUND OF THE INVENTION

A wide variety of techniques and process have been developed in the prior art for forming a wide variety of printed circuit boards having various design characteristics for different applications.

These printed circuit boards are formed from layers of different materials which are laminated together under relatively high pressure and temperature in order to form the printed circuit boards. The printed circuit boards or laminates typically include a core material or dielectric formed, for example, from epoxy impregnated glass cloth layers which are laminated together with other circuit forming components, conductors, etc. in the finished printed circuit boards.

Although the present invention is directed toward a method for fabricating such printed circuit boards, the actual construction features of the printed circuit boards themselves are not a feature of the invention. Generally for purposes of the present invention, it is sufficient to understand that the printed circuit boards are formed from laminated layers as discussed above, a substantial portion of those layers involving core material formed for example from glass cloth and epoxy resin as discussed above. As will be noted in greater detail below, the epoxy resin is particularly troublesome during formation of the printed circuit boards since it tends to be migratory and frequently contaminates molding surfaces in contact with the printed circuit boards or laminates.

Typical methods for forming printed circuit boards are discussed for example in U.S. Pat. No. 4,201,616 issued May 6, 1980 to Chellis, et al. and U.S. Pat. No. 4,753,847 issued June 28, 1988 to Wilheim, et al. as well as a substantial number of other U.S. patents cited or discussed within the above two references. Both of the above references as well as the references cited or discussed therein are incorporated by reference in this application as though set forth in their entirety in order provide a more complete discussion of background material in connection with the present invention.

In molding printed circuit boards or laminates as discussed above, the various layers or laminates of the respective printed circuit boards are arranged together and pressed under relatively high pressure and temperature as noted above in order to produce the finished board. Futhermore, for purposes of economy, multiple combinations of laminates are commonly formed into respective printed circuit boards simultaneously between a pair of mold dies or the like. In such operations, separator mold plates, also sometimes referred to as caul plates, planishing plates, etc. are employed between the respective printed circuit board or laminate assemblies as well as between the mold dies and surfaces of adjacent printed circuit board laminates.

Within such molding operations, it is also common practice to employ tooling pins extending in spaced apart relation between the molding dies and through both the laminate assemblies and the separator plates in order to assure that all of the components remain in proper alignment during the molding operation. The holes provided in the separator mold plates for accommodating these tooling pins present particular problems as noted in greater detail below.

Generally, it is desirable to re-use the separator mold plates which are commonly formed from hard metals such as stainless steel, spring steel, aluminum, etc., again for purposes of economy. At the same time, it is necessary to assure that the surfaces of the separator mold plates are clean so that they form generally true and accurate surfaces on the laminate structures. At the same time, it is also necessary to assure that foreign material is not transferred to the laminates from the separator mold plates during the molding operation.

For this reason, mold release agents have been occasionally employed on the surfaces of separator mold plates or between separator mold plates and the laminate assemblies to prevent such undersirable transfer of contaminating materials. However, it is also to be noted that the mold release agents themselves may be contaminating materials inasfar as the laminate assemblies are concerned. Accordingly, it is also important to assure that the mold release agent is not deposited upon or transferred to the surface of the printed circuit board laminate formed during the molding operation.

The Wilheim, et. al. patent referred to above is typical of prior art processes wherein separate sheets of mold release material are arranged between the separator mold plates and the laminate structures. In particular, that patent discloses the use of separate mold release sheets formed from a film of polyester, nylon or cellulose acetate treated for promoting resin adhesion and having a coating of a thin release layer of a cured release acrylated oligomer resin on at least one side of the film.

Although such mold release sheets or film are effective when properly employed, they tend to be expensive in molding operations such as those discussed above because of labor intensive steps of properly arranging the mold release sheets in place prior to each molding operation. At the same time, the separate sheets commonly result in surface defects in the printed circuit boards or laminates usually due to irregularities resulting from laying down of the mold release sheets or films. For example, manual laying down of the film commonly results in creases or wrinkles, overlapping seams, discontinuities and other surface irregularities which also tend to appear in the surfaces of the printed circuit boards or laminates formed by the process.

Furthermore, since the film is not integrally associated with the separator mold plate, discontinuities or defects in the sheets may permit materials such as the migratory epoxy referred to above to penetrate onto the surface of the separator mold plate. Since the epoxy material interferes with the necessary smooth surface of the plate and also because the epoxy tends to strongly adhere to the metal plates, it is therefore commonly necessary to remove the epoxy by abrasive grinding between molding operations. The abrasive grinding is not only time consuming and expensive in connection with the molding operation, it also tends to abrade the surface of the mold release plates and to reduce their normal operating lifetime in such molding operations.

Other prior art techniques have comtemplated the use of a wide variety of mold release agents integrally applied to the surfaces of the separator mold plates. U.S. Pat. No. 4,371,476 issued Feb. 1, 1983 to Newkirk, et. al. disclosed a variety of mold release agents contemplated for applications other than the molding of printed circuit board laminates as contemplated by the present invention.

Prior art mold release agents applied directly to the surfaces of the separator mold plates were generally applied either as part of sequential molding operations or permanently applied, for example, as flame-sprayed powder coats. Generally, the prior art mold releases applied to the separator mold plates as part of the molding operations have tended to suffer from discontinuities, surface irregularities and poor mold release characteristics. Such surface irregularities may include puddling of the mold release agent and unacceptable variations in thickness, both of these irregularities tending to arise during applications of the mold release agent to the plates. These mold release agents applied to the plates as part of the molding operation have also tended to undesirably transfer to the printed circuit board laminate surfaces and to detract from their subsequent processability.

Where the mold release agents have been permanently applied, for example, as flame-sprayed powder coats, as precoatings, they have tended to be relatively thick and also to suffer from development from surface irregularities, for example due to chipping of the mold release agent. Failure of the precoated mold release agents was particularly expensive and time consuming since it generally involved the need for completely stripping the precoated mold release agent from all surfaces of the separator mold plate and then replacing and curing a coating of the mold release agent before returning the separator mold plates to the molding operation.

Repeated application of such materials to the plates tended to produce surface irregularities upon the plates, often because of substantial build-up, and also tends to result in undesirable transfer of contaminating materials to the printed circuit boards.

In other cases, mold release agents were applied as permanent precoats (flame sprayed powder coatings) to the separator mold plates and anticipated to last through large numbers of repeated mold operations. However, these precoated separator mold plates have been found to be relatively expensive and subject to the development of discontinuities in the mold release material due, for example, to chipping, etc. Thus, it was again relatively expensive and time consuming to maintain the separator mold plates in condition for large numbers of sequential molding operations as referred to above.

SUMMARY OF THE INVENTION

There has accordingly been found to remain a need for improved processes for molding printed circuit board laminates and more particulary for providing separator mold plates capable of being used repeatedly in sequential molding operations without the need for expensive and time consuming removal of foreign material or contaminants adhered to the surfaces of the plates.

More specifically, it is an object of the invention to provide a method of high temperature sequential molding of printed circuit board laminates comprising the steps of arranging separator mold plates between mold die elements and adjacent laminate surfaces and also between facing laminate surfaces, particularly where mulitple printed circuit board laminates are simultaneously molded, and integrally applying at least one thin, continuous coat of a silane-based mold release composition to surfaces of each separator mold plate prior to each sequential molding operation in order to facilitate their repeated use in the sequential molding operations.

Preferably, each thin, continuous coat of silane-based composition is on the order of about 1 microinch thickness, at least two coats preferably being applied to the surface of the plates prior to their use in a first molding operation. The integral application of mold release coating of such a thickness and composition prior to each use to the separator mold plates in a molding operation assures the presence of a continuous coat of the mold release agent for preventing adhesion to the plates of contaminating materials such as epoxy, the limited thickness of the coating also permitting application of an additional coat prior to each sequential molding operation without excessive build-up even after use of the plates in many sequential molding operations.

The mold release composition is preferably integrally applied by a spray gun in a reciprocating pattern as summarized in greater detail below, the coating preferably being cured by infrared heat to facilitate re-use of the plates in a relatively short period of time while avoiding undersirable transfer of the mold release agent to the printed circuit board laminates.

Even more specifically, the present invention contemplates a method of conditioning separator mold plates for repeated use in high temperature sequential molding of printed circuit board laminates as well as the coated plates themselves as a product of the method. Preferably, the conditioning method contemplates integral application of the silane-based mold release composition to the plates by a spray gun in a reciprocating or zig-zag pattern. The spray gun is preferably of an air atomizing type and even more preferably is also of high transfer efficiency type.

The invention particularly contemplates that the spray gun for integrally applying the coating and a subsequent infrared dryer are preferably included in an automated processing line. The processing line preferably includes conveyer means for carrying a progression of the separator mold plates past the spray gun and infrared dryer. The automated process even more preferably includes scrubber means for removing extraneous material from the plates before they are subjected to coating by the spray gun. Similarly, the automated process also preferably includes stacking means for receiving the plates after they pass from the infrared dryer in order to complete the curing of the coating.

As noted above, it is a further object of the invention to provide the separator mold plates as a product of the method wherein an integrally applied coat or coats of silane-based mold release composition is continuously coated over the surfaces of the plates, preferably to a thickness on the order of about 1 microinch in order to facilitate use of the separator mold plate in sequential molding of printed circuit board laminates.

Additional objects and advantages of the invention are made apparent in the following description having reference to the accompanying drawings.

BRIEF DESCRIPTION OF THE DRAWINGS

FIG. 1 is a side view in elevation of a plurality of printed circuit board laminate assemblies arranged in parallel relation between a pair of mold die elements with separator mold plates arranged between the adjacent laminate assemblies and between the end assemblies and the die elements in a manner contemplated for sequential molding of the printed circuit board laminates.

FIG. 2 is a plan view of one of the separator mold plates.

FIG. 3 is a similar plan view of one of the separator mold plates with a reciprocating zig-zag path superimposed thereupon corresponding to a manner in which a mold release composition coating is integrally applied to the surfaces of the separator mold plates.

FIG. 4 is a schematic side view in elevation of an automated processing line for conditioning the separator mold plates according to the present invention between successive molding operations.

FIG. 5 is a plan view of the automated processing line of FIG. 4 taken along section lines V—V.

FIG. 6 is a view taken along section lines VI—VI in FIG. 4 to illustrate reciprocating operation of spray guns adapted for producing the reciprocating zig-zag path illustrated in FIG. 3.

DESCRIPTION OF THE PREFERRED EMBODIMENT

Referring now to the figures and particularly to FIG. 1, the present invention generally and broadly contemplates a method for molding or forming large numbers of printed circuit board laminates in sequential molding operations.

A plurality of the printed circuit board laminate assemblies are indicated at 10 and arranged in parallel alignment between conventional mold die elements 12 and 14. The die elements 12 and 14 are adapted for being moved toward each other as illustrated in FIG. 1 in order to mold or compress the parallel alignment of printed circuit board laminate assemblies. Separator mold plates 16 of similar configuration are arranged between adjacent lateral surfaces of the printed circuit board laminate assemblies 10 and also between the mold die elements 12, 14 and adjacent lateral surfaces of the respective laminate assemblies 10.

Molding operations of the type schematically represented in FIG. 1 may optionally be carried out with tooling pins 18 and 20 adapted for maintaining proper alignment of the laminate assemblies 10 and separator mold plate 16 during each molding operation. A number of such tooling pins, two of which are illustrated in FIG. 1, may extend between the mold die elements 12 and 14 while passing through all of the printed cicuit board laminate assemblies 10 and separator mold plate 16. Accordingly, where such tooling pins are employed, the separator mold plates 16 and laminate assemblies 10 are formed with appropriately spaced holes for receiving the tooling pins.

It is to be understood that the sequential molding operation schematically illustrated in FIG. 1 may be employed for forming or molding any of a variety of printed circuit board laminate assemblies. Accordingly, the specific composition and relative arrangement of laminations or layers 22 within the laminate assemblies 10 is not described further for purposes of the present invention since those details will be well known to those skilled in the art of printed circuit board molding.

As generally indicated above, it is important to realize that the printed circuit board laminate assemblies 10 commonly include materials such as epoxy which are migratory particularly under the relatively high pressure and high temperature conditions contemplated in the molding operation. Accordingly, the separator mold plates 16 are oversized relative to the printed circuit board laminate assemblies 10 in order to prevent such materials from undesirably migrating between adjacent laminate assemblies.

At the same time, the separator mold plates 16 are typically formed from hard metals such as stainless steel, spring steel, aluminum, etc. The lateral surfaces of the separator mold plates 16 are also smooth or polished both to facilitate the formation of smooth, dimensionally accurate surfaces upon the printed circuit board laminate assemblies 10 and also to resist adhesion of contaminating materials, typically epoxy extruded from the laminate assemblies 10 when they are subject to both relatively high pressure and temperature.

It is also obviously important to be able to rapidly perform sequential molding operations as illustrated in FIG. 1 in order to maintain relatively low unit costs for each of the printed circuit board laminate assemblies 10. For that reason, the present invention comtemplates an additional process for conditioning or reconditioning the separator mold plates between sequential molding operations so that the separator mold plates may be rapidly employed in combination with a new combination or parallel arrangement of printed circuit board laminate assemblies 10 positioned between the mold die elements 12 and 14. As noted above, the prior art contemplated mold release agents with a variety of compositions and forms for protecting the surfaces of the separator mold plates in this manner. These prior art forms (not shown herein) included separately formed sheets of material adapted for arrangement adjacent the surfaces of the separator mold plates within a molding operation as generally illustrated in FIG. 1 and also mold release compositions which were integrally coated or applied directly to the surfaces of the separator mold plates. Generally, the separate sheets of mold release material have been found to be relatively labor intensive and to suffer other disadvantages as summarized above.

Separator mold plates with relatively permanent mold release agents, such as the flame-sprayed powder coats, tended to be subject to disadvantages as also discussed above.

These disadvantages of the prior art have been noted herein in order to better emphasize the surprising and unexpected degree to which the conditioned separator mold plates of the present invention have avoided similar disadvantages.

In conditioning the separator mold plates prior to use in each sequential molding operation, the present invention contemplates integral application of a coat of a mold release agent of selected composition upon both lateral surfaces of the separator mold plates.

The particular mold release composition contemplated by the present invention is a silane-based material of a type employed as a mold release agent in applications other than that specifically contemplated by the present invention. Silane-based compositions of the type contemplated by the invention are commercially available for example under the trade names FREKOTE 44 and FREKOTE 33, available from Dexter Hysol, Aerospace & Industrial Product Division, Seabrook, N. H.

Silane-based mold release compositions such as those specifically noted above have been found to be particularly useful in the present invention in that they are capable of integral application, for example by spraying to form continuous coatings with a uniform thickness in the order of about 1 microinch. Nominally, uniform coatings of such materials have been formed which are continuous and have average thicknesses of about 1 microinch. Additional advantages accrue from the silane-based material due to its drying and curing characteristics. Specifically, at least when the silane-based compositions are applied in thin layers as noted herein, the coating is dry to the touch almost immediately after application. Thus, the mold release coating is unaffected by the passage of the separator mold plates along the conveyer in the automated processing line, etc. In addition, the silane-based compositions have been found capable of curing in order to prevent their being dislodged from the separator mold plates, particularly under the high pressure and high temperature conditions of molding operations as schematically illustrated in FIG. 1.

Generally, it has been found that these silane-based compositions will cure suitably for use in molding operations after a period of about four hours at room temperature. That cure duration may be substantially reduced, for example typically to about one half hour by subjecting the coated separator mold plates to infrared heat at about 200° F.

The silane-based mold release compositions of the present invention are thus particularly advantageous in that they form an integral film upon the separator mold plates so that migratory materials such as epoxy are not capable of penetrating between the mold release agent and the surface of the separator mold plate. In addition, the ability of the silane-based mold release agent to be integrally applied in a continuous layer with a thickness of about 1 microinch further facilitates its use in conditioning the separator mold plates. In particular, because of the minimum thickness of the film, an additional coating of the silane based mold release composition can be applied to the surfaces of the separator mold plates prior to each sequential molding operation without excessive build-up occurring, even after the separator mold plates have been employed in large numbers of molding operations.

It has further been discovered that the silane-based mold release composition is best applied in a thin, continuous and integral layer by being sprayed in a reciprocating zig-zag pattern as generally indicated by the superimposed path 22 illustrated in FIG. 3. More preferably, the invention contemplates application of the silane-based mold release composition by a spray gun moving relative to the surface of the separator mold plate along a reciprocating zig-zag path as indicated at 22. With such a reciprocating zig-zag path being employed, the spray gun may for example be of a variety of types, including an aerosol type or air atomizing type.

However, the invention further preferably contemplates that the spray gun be of the air atomizing type for assuring optimum continuity of the coating at minimum thickness.

Even more preferably, the spray gun is contemplated as being of a high transfer efficiency type in order to assure maximum transfer of spray from the gun to the surface of the separator mold plate.

Spray guns of the type referred to above are available from a number of sources. For example, a spray gun available from Binks under the trade name 2001 HTE Spray Gun or High Transfer Efficiency (HTE) System has been found to be particularly effective in the present invention.

Due to the ability of the silane-base mold release composition coating of the present invention to prevent adhesion of contaminating materials such as epoxy, it has also been found unnecessary to subject the separator mold plates to abrasive grinding or the like in order to condition it for use in a subsequent molding operation. Thus, the separator mold plates may be relatively thinner while being otherwise equally effective for use in molding operations as illustrated in FIG. 1. Futhermore, the separator mold plates are preferably contemplated by the present invention to be formed from relatively inexpensive spring steel. Although such a material is subject to corrosion, it is protected from the environment by the continuous film of silane-base mold release composition in the present invention.

Thus, with the silane-based mold release composition coating of the present invention, the separator mold plates may be conditioned for re-use in sucessive molding operations simply by removing extraneous material from the surfaces of the plates, for example by scrubbing them with water. Thereafter, an additional thin, continuous and integral layer of the silane-based mold release composition is applied to all surfaces of the separator mold plates so that they are again ready for use in a subsequent molding operation at least after the silane-based mold release composition is allowed to cure as described above. In addition to facilitating and simplifying conditioning of the separator mold plates between sequential molding operations, the reduced thickness of the separator mold plates made possible by the present invention also permits an increased number of printed circuit board laminate assemblies 10 to be formed during each molding operation as generally indicated in FIG. 1.

The separator mold plates of the present invention are substantially thinner than some prior art separator plates having thickness of about 40 mils. More particularly, the separator mold plates of the present invention have a uniform thickness of about 20 mils.

The conditioning of the separator mold plates is preferably carried out in an automated assembly line as illustrated in FIGS. 4-6.

The automated processing line is generally indicated at 24 and includes a linear conveyer 26 formed with a plurality of rollers 28 preferably formed from a polyfluoroethylene polymer material, available for example under the trade name TEFLON from the DuPont Company.

The automated processing line 24 includes a number of stations arranged in order along the length of the conveyer 26. Those stations include initially a scrubber unit 30 for removing extraneous surface deposit from the separator mold plates 16 passing along the conveyer line. The scrubber unit 30 include rotating brushes 32 and 34 respectively arranged above and below the conveyer line for scrubbing opposite surfaces of each separator mold plate 16 while water is sprayed onto the brushes by nozzles 36. Additional means (not shown) may be included in the scrubber unit 30 to assure removal of all water from the surfaces of the separator mold plate 16 before they pass to a coating unit 38. Since the silane-based mold release composition coating is applied to the separator mold plate 16 within the coating unit 38, it is arranged within a tunnel 40 in order to minimize escape of the silane-based mold release composition to the atmosphere.

The coating unit 38 includes a fabricated assembly 42 adapted for oscillating movement laterally relative to the longitudinal path of the separator mold plate 16 on the conveyer 26. Longitudinal movement of the separator mold plate 16 is indicated by an arrow 44 while lateral movement of the assembly 42 is indicated by another arrow 46.

In any event, spray guns of the type specifically described above are arranged both above and below the conveyer 26 within the coating unit 38. Spacing between rollers 28 of the conveyer 26 is provided as indicated at 48 to permit material from the spray guns 50 and 52 to form a continuous coating upon opposite surfaces of the plate 16.

Oscillating or reciprocating movement of the assembly 42 mounting the spray guns 50 and 52 may be controlled either manually or by an automated control unit schematically indicated at 54 in FIG. 6.

With such an arrangement, both the reciprocating speed of the spray guns 50 and 52 as well as the longitudinal movement of the separator mold plates 16 along the conveyer 26 may be adjusted to assure integral application of a thin continuous coat of silane-based mold release composition as noted above. Preferably, at least with the spray guns of the type described above, it has been found preferable to operate the reciprocating assembly 42 and the conveyer 26 in order to produce a vector speed along the reciprocating zig-zag path 22 (see FIG. 3) of about 100 feet per minute.

The silane-based mold release compositions preferably employed by the present invention and discussed above, are provided with a solvent carrier to facilitate spraying of the material. Preferably, the silane-based mold release compositions are provided in a very volatile hydrocarbon solvent. Thus, when the material is sprayed onto the surfaces of the separator plates, the solvent rapidly volatilizes in order to leave a deposited film or coat of the silane-based mold release composition in place upon the surface of the separator mold plates.

As the separator mold plates 16 are carried by the conveyer 26 away from the coating unit 38 with thin, continuous layers of silane-based mold release composition applied to all surface thereof, the plates then pass through a dryer unit 56 also in the form of a tunnel with infrared heating elements 58 and 60 being arranged above and below the conveyer 26 for heating and drying both surfaces of the plates. Preferably, the dryer unit 56 is selected for elevating the temperature of the coated separator mold plates to about 200° F. in order to accelerate curing of the silane-based mold release composition coatings thereon.

As the separator mold plates 16 pass from the dryer 56, they are preferably stacked on to of the other in a stacking unit 62. The elevated temperature of the separator mold plates is generally maintained in the stack in order to further accelerate curing of the silane-based mold release composition.

Within a selected time after application of the silane-based composition, typically about one half hour, the separator mold plates are again ready for use in a molding operation of the type illustrated in FIG. 1.

When the separator mold plates 16 are first being conditioned for use in molding operations and have no mold release material thereon, they are preferably subjected to a plurality of coats, preferably about three coats in the processing line 24 of FIGS. 4 and 5. Thereafter, an additional coat of silane-based mold release composition is applied by the processing line between successive molding operations. Thus, the separator mold plates 16, which are a product of the method or process as described above, may be characterized by varying numbers of coats of the silane-based composition. However, even after the separator mold plates have been employed in a large number of molding operations and conditioned and equal number of times in processing line 24, there is no excessive build-up of mold release agent on the surface of the plates so that they are capable of re-use a large number of times.

Thus there has been described a method of using and re-using separator mold plates in the molding of printed circuit board laminate assemblies and a method for rapidly and simply conditioning the separator mold plates or re-use in the molding operations, together with a coated separator mold plates as a product of the method. Numerous variations and modifications will be apparent in addition to those specifically described above. Accordingly, the invention is defined only by the following appended claims which provide additional examples of the invention.

What is claimed is:

1. A method of high temperature sequential molding of multiple printed circuit board laminates comprising the steps of arranging separator mold plates between mold die elements and adjacent laminate surfaces and between facing laminate surfaces of different printed circuit board laminates are simultaneously molded, integrally applying at least one thin, continuous coat of about one microinch thickness of a silane-based mold release composition to opposite surfaces of each separator mold plate prior to each sequential molding operation for facilitating repeated use of the plates in sequential molding operations and to maintain dimensionally accurate surfaces on the respective printed circuit board laminates while avoiding the need for hard abrasive cleaning of the separator mold plates between sequential molding operations, and selecting the thickness of the silane-based mold release coating to permit application of an additional coat prior to each sequential molding operation to assure coating continuity on opposite surfaces of the plates without excessive build-up even after use in many sequential molding operations.

2. The method of claim 1 further comprising the step of applying at least two coats to each opposite surface of the plate prior to its use in a first molding operation.

3. The method of claim 1 further comprising the step of forming holes in the separator mold plates for receiving tooling pins also passing through the printed circuit board laminates, the integrally applied silane-base mold release composition assuring continuity of the coat about the holes.

4. A method of conditioning separator mold plates for repeated use in high temperature sequential molding of assemblies of multiple printed circuit board laminates, comprising the steps of:

(a) carrying a progression of separator mold plates through automated sections of a continuous process by conveyor means;

(b) spraying a thin, integral coating of about one microinch thickness of a silane-based mold release agent in a reciprocating zig-zag pattern on opposite surfaces of each separator mold plate prior to each sequential mold operation in one automated station of the process;

(c) curing the coating on the progression of separator mold plates in a subsequent automated drying station enclosed by tunnel means; and (d) repeating steps (a)-(c) prior to re-use of the mold plates in each sequential molding operation, whereby repeated use of the plates is facilitated in an efficient manner while maintaining dimensionally accurate surfaces on the multiple printed circuit board laminates and avoiding the need for hard abrasive cleaning of the separator mold plates between sequential molding operations.

5. The method of claim 4 further comprising the step of applying at least two coats to each opposite surface of the plate prior to its use in a first molding operation.

6. The method of claim 4 wherein spraying is carried out by a spray gun of an air atomizing and high transfer efficiency type.

7. The method of claim 4 wherein the step of curing is carried out by infrared heating after each application of silane-based mold release composition in order to cure the coating.

* * * * *